(12) United States Patent
Chinn et al.

(10) Patent No.: US 7,052,622 B2
(45) Date of Patent: May 30, 2006

(54) METHOD FOR MEASURING ETCH RATES DURING A RELEASE PROCESS

(75) Inventors: Jeffrey D. Chinn, Foster City, CA (US); Robert Z. Bachrach, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 630 days.

(21) Appl. No.: 10/265,620

(22) Filed: Oct. 8, 2002

(65) Prior Publication Data

US 2003/0124848 A1 Jul. 3, 2003

Related U.S. Application Data

(60) Provisional application No. 60/345,103, filed on Oct. 17, 2001.

(51) Int. Cl.
*C03C 15/00* (2006.01)

(52) U.S. Cl. .............................. 216/58; 216/59; 216/73; 216/74

(58) Field of Classification Search ................. 216/58, 216/59, 73, 74
See application file for complete search history.

(56) References Cited

U.S. PATENT DOCUMENTS

| 5,788,871 | A | 8/1998 | Huh ............................ 216/84 |
| 5,963,788 | A | 10/1999 | Barron et al. ................. 438/48 |
| 6,238,580 | B1 * | 5/2001 | Cole et al. ..................... 216/2 |
| 6,544,478 | B1 * | 4/2003 | Oyama et al. ........... 422/82.01 |
| 6,790,376 | B1 * | 9/2004 | Markle et al. ................ 216/84 |

FOREIGN PATENT DOCUMENTS

| DE | 196 41 070 | 4/1998 |
| JP | 01236633 | 9/1989 |

OTHER PUBLICATIONS

PCT Search Report.
Translation of DE 196 41 070.

\* cited by examiner

*Primary Examiner*—Nadine G. Norton
*Assistant Examiner*—Binh X. Tran

(57) ABSTRACT

A method of determining the time to release of a movable feature in a multilayer substrate of silicon-containing materials including alternate layers of polysilicon and silicon oxide wherein a mass monitoring device determines the mass of a released feature, and the substrate is etched with anhydrous hydrogen fluoride until the substrate mass is equivalent to that of the released movable feature when the etch time is noted. A suitable mass monitoring device is a quartz crystal microbalance.

7 Claims, 4 Drawing Sheets

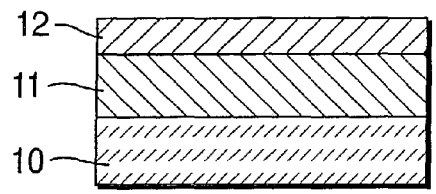
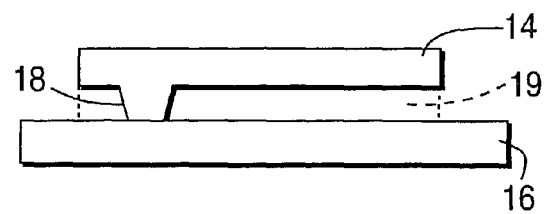
FIG. 1     FIG. 2
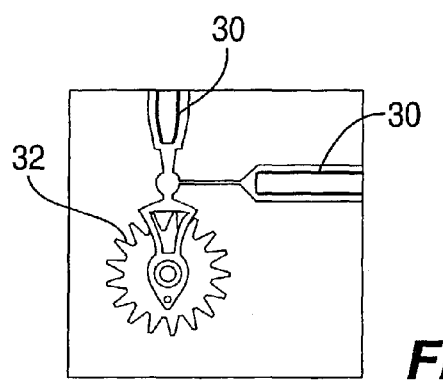
FIG. 3
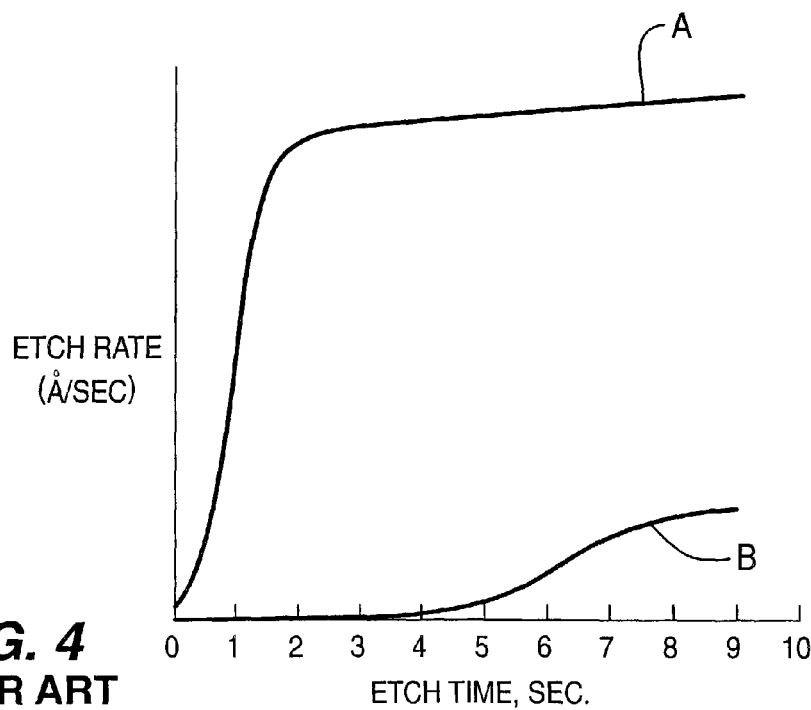
FIG. 4
PRIOR ART

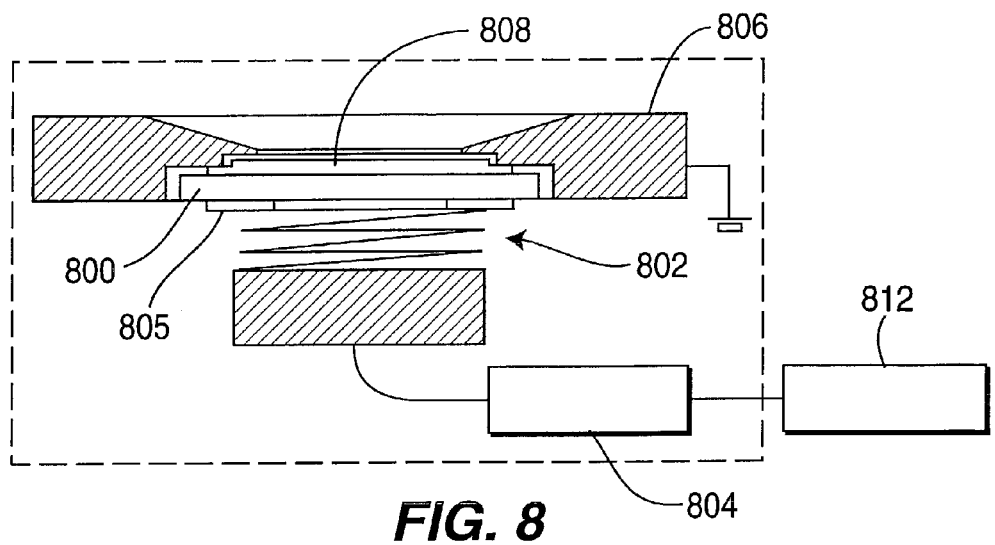
FIG. 8
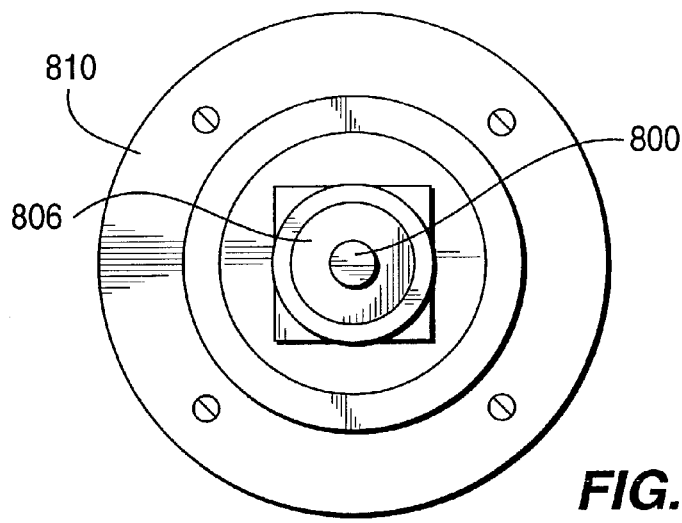
FIG. 8A
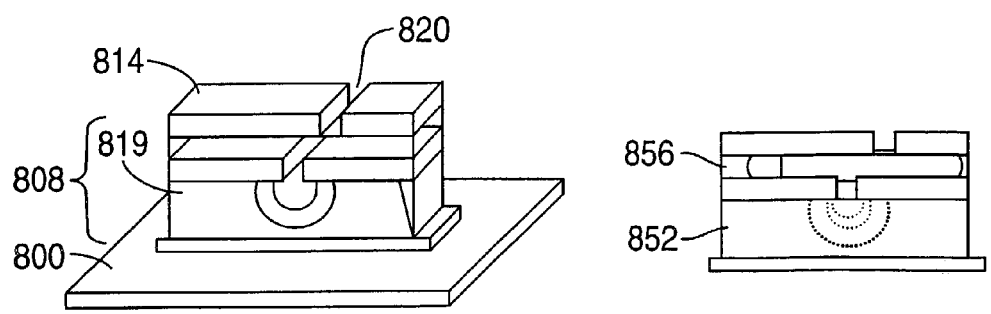
FIG. 8B
FIG. 8C

METHOD FOR MEASURING ETCH RATES DURING A RELEASE PROCESS

This application claims priority of application Ser. No. 60/345,103 filed Oct. 17, 2001.

BACKGROUND OF THE INVENTION

Microelectromechanical systems (hereinafter MEMS) have been developed for movable devices such as hygroscopes, accelerometers, tunable RF capacitors, digital mirrors, sensors and the like. They are used for forming electrical and mechanical structures on a substrate, particularly a substrate of silicon or silicon-containing material. They are made using conventional semiconductor processing techniques, such as chemical vapor deposition and plasma etch for example.

During fabrication, the devices are formed from a layer of material, part of the substrate, which is partially, but controllably, etched away to release portions of the device from the substrate so as to form movable parts. The device however can remain anchored to the substrate after its release. The etched, or sacrificial layer, is suitably a silicon oxide.

FIG. 1 illustrates a simple three-layer substrate that can be used to make a MEMS device. The substrate in a cross sectional view, includes a layer of silicon 10 covered with a layer of silicon oxide 11 and a layer of polysilicon 12 thereover. The layer of silicon oxide 11 is to be etched to release or suspend the layer 12 above the silicon substrate 10.

FIG. 2 is a cross sectional view of an embodiment of the invention that illustrates a released polysilicon device. A lever 14 is released, or partially separated from, a silicon substrate 16, except for a connection or anchor 18. The lever 14 is free to move up and down with respect to the substrate 16 after actuation, as by an electric signal. A layer of silicon oxide 19, shown in phantom, has been partially etched away to release or separate the lever 14 from the substrate 16.

Release is a complex process wherein the silicon/silicon oxide material is controllably removed, or etched away. If too much material is removed, the desired structure is undercut, so it is no longer anchored to the substrate. On the other hand, if too little material is removed, frozen structures are formed that are not able to move as intended.

An example of a more complex MEMS device is shown in FIG. 3. FIG. 3 is a top view of two orthogonal linear drives 30 that are linked to a rotary gear 32. When properly released, the rotating gear 32 has unlimited movement, and can revolve in excess of 350,000 revolutions per minute (rpm). This device has been demonstrated to have a lifetime of over $7 \times 10^9$ revolutions with millions of start/stop cycles.

Different materials have different problems that are encountered during the release etch process. This is illustrated in FIG. 4, which is a graph of etch rate, in angstroms per second, versus etch time in seconds, for an aqueous hydrogen fluoride etch of different materials. Line A is the etch rate for doped CVD silicon oxides, such as borophosphosilicate glass (BPSG), phosphosilicate glass (PSG), and borophosphotetraethoxysilane (BPTEOS). The process time increases rapidly to a fairly stable etch rate. Line B however, which is illustrative of the etch rate for dense oxides, such as thermal oxide, TEOS and high temperature deposited oxides (HTO), shows a long initiation time, of almost 5 seconds, and then only a slow increase in the etch rate. It is apparent that there is an initiation time for dense silicon oxides that is not found for doped oxides. Further, the etch rate is much higher for doped CVD oxides. As is known, etch rates also vary with device design.

An aqueous HF etch solution, or an HF bath, is very easy to make, easy to use, and it is inexpensive. Thus an aqueous solution of HF has traditionally been used to isotropically etch silicon oxides. However, the surface tension of the solution causes capillary forces to pull the micro-sized structures together, and causes what is known as stiction, or sticking together of the etched parts so they are not able to move freely.

The initiation time, as discussed above, also varies with the amount of water present in various silicon oxides. Thus it is very difficult to determine just when etching begins using aqueous HF, and to determine the time one needs to etch in order to obtain release, but not total separation of, a device from its substrate.

Using aqueous HF as the etchant, FIG. 5, which is a graph of the amount of material removed by the etchant versus the time etching is continued, in seconds, for different silicon oxides. Line A shows the removal rate for a first group of doped CVD silicon oxides, such as PSG. Line B shows the removal rate of silicon oxide deposited from TEOS, and line C shows the removal rate of dense TEOS oxide. PSG etches much faster than dense TEOS oxide using aqueous HF as the etchant, while TEOS oxide has an intermediate etch rate. Thus 5000 Å of PSG can be removed in one minute, while only 1000 Å of dense TEOS oxide is removed in one minute.

In view of the above problems of aqueous HF, anhydrous HF, which is also an excellent isotropic etchant, has also been considered. However, it is a very strong acid, and thus attacks materials from which an etch chamber is generally made, and its fumes are dangerous. Thus this etch must be carried out in a suitable chamber, one that is at least partly impervious to strong acids. The advantage to using anhydrous HF however is that the liquid-solid phase does not exist as it does in an aqueous HF solution, and capillary forces that cause stiction are by-passed, greatly reducing the amount of stiction caused during the etch.

However, anhydrous HF has the same problems of variation of etch rates and initiation times as does aqueous HF.

Various methods have been tried to determine the actual amount of time required to release particular devices from particular substrates. Mass spectrophotometers have been used to identify substrates and the amount etched in a given time period, but they can only be used at low pressures. Optical microscopes have been used to monitor etching in real time, but process conditions can interfere with proper viewing.

Thus a means for monitoring the etch rate, and thus the time to release, of a device from its substrate, in real time, using anhydrous HF, has been sought. The etch monitor and method of use for silicon-containing materials must monitor the etch so it can be carried out in a highly controllable way, one that avoids both underetching and overetching, and that avoids stiction when forming MEM structures.

SUMMARY OF THE INVENTION

The present invention is directed to a method of determining release of a MEMS feature from its substrate in real time by means of a mass monitoring device, and determining the amount of material removed over time until release is achieved. In particular, the present invention is directed to the use of a quartz crystal microbalance (QCM) mounted near the substrate in an etch chamber to measure a release process in real time.

A patterned test substrate, similar to the device to be released, can be mounted on the QCM crystal and, using the same process and materials to be used to form the MEM device, the etch rate is monitored by detecting the weight of material remaining on the balance with time, and determining when the monitored feature is released, but not separated, from its substrate. Once the time to release is determined, successive like structures then can be made by monitoring the etch time alone, providing a method that is exact and simple.

Alternately, the mass of material to be removed in making a device feature can be predetermined, and a mass monitoring device attached to the substrate to be processed, and processing stopped when the desired mass of material has been removed.

BRIEF DESCRIPTION OF THE DRAWING

FIG. 1 is a cross sectional view of a simple trilayer substrate to be processed in accordance with the invention.

FIG. 2 is a cross sectional view of a lever released from a substrate.

FIG. 3 is a top view of a rotary gear linked to linear drivers after release from a silicon substrate.

FIG. 4 is a graph of etch rate versus process time for various silicon oxides using aqueous HF as the etchant.

FIG. 8 is a cross sectional view of a quartz crystal microbalance (hereinafter QCM) to be mounted in a processing chamber.

FIG. 8A is a cross sectional view of a QCM having a patterned substrate.

FIG. 8B is a top view of a QCM having a substrate mounted thereon and a means of attaching it to a processing chamber.

FIG. 8C illustrates a QCM having a substrate mounted thereon having multiple layers to be etched.

DETAILED DESCRIPTION OF THE INVENTION

Microelectromechanical devices as employed herein refers to devices having a micromachined or etched component configured to move relative to a substrate coupled with the component.

A substrate is common to all microstructure devices. Such a substrate can include a semiconductor material, and can be a bulk material, or a plurality of layers that can be patterned using semiconductor techniques. Suitable the semiconductor material can include a silicon wafer, silicon on insulator layers and silicon wafers bonded to an underlying layer.

Layers deposited over the substrate comprise a sacrificial layer, generally of a silicon oxide, and a layer of a silicon-containing material such as polysilicon thereover. The sacrificial layer is isotropically etched away to isolate the overlying silicon-containing layer and permit it to move with respect to the substrate. The silicon-containing layer however must be attached or connected to the substrate.

Thus the removal rate of the sacrificial layer must be able to be monitored so that separation of a portion of the silicon-containing layer is achieved, but without disconnecting this layer from the substrate. When this occurs, the feature is said to be released.

Figure 5:
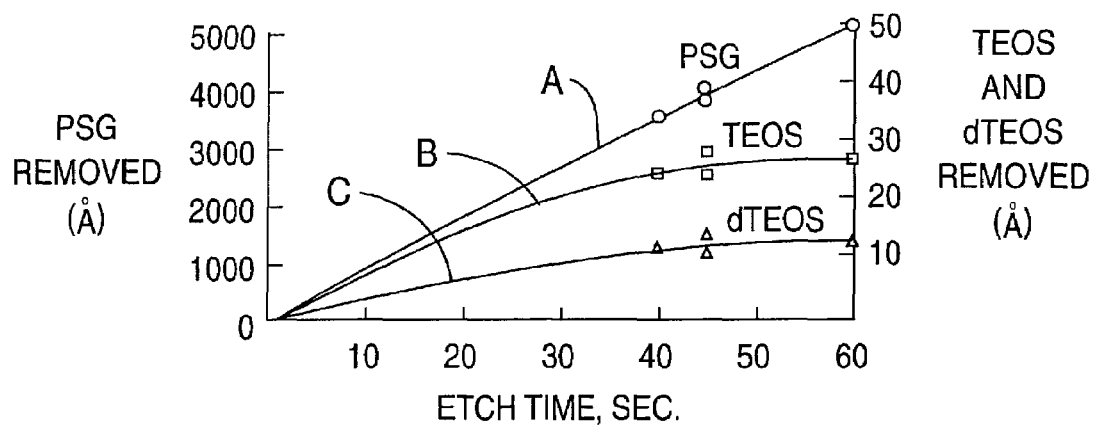
FIG. 5 is a graph of removal rates over time for various silicon oxide materials.
Figure 6:
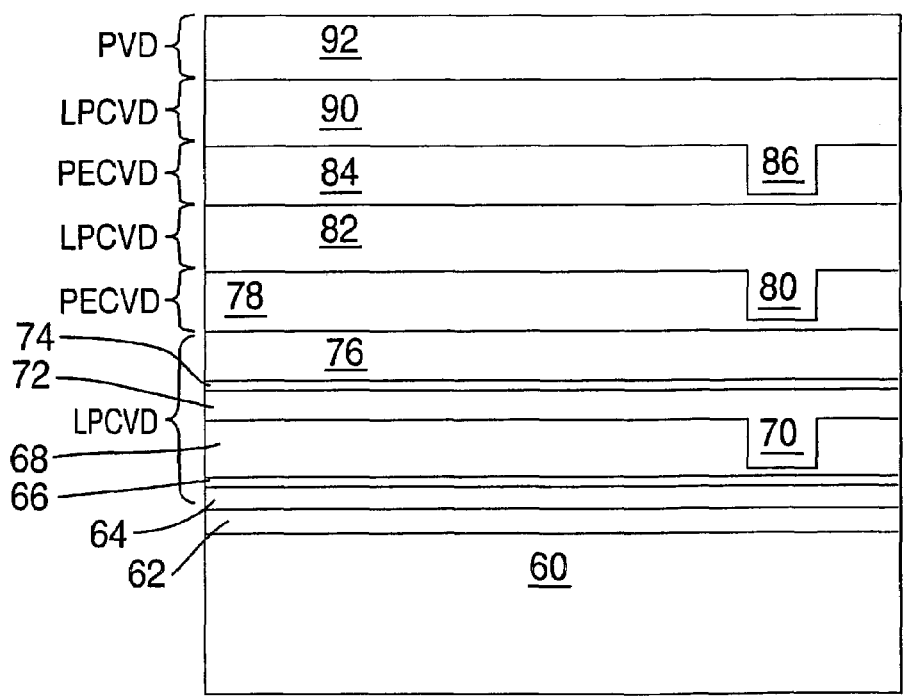
FIG. 6 is a cross sectional view of a multilayer substrate for making complex microstructures.

A multilayered substrate that can be patterned to form complex microstructures is shown in FIG. 6. An n-type, 6 inch silicon wafer 60 has a layer 62 of thermal silicon oxide about 0.63 micron thick thereover; and an overlying layer 64 of silicon nitride about 0.8 micron thick. A first layer of sacrificial silicon oxide 68 about 2.0 microns thick is deposited thereover. The silicon oxide layer 68 is patterned to form an opening 70, but an opening that is not etched down to the silicon layer 66, but that retains a layer of silicon oxide about 0.3 micron thick. A layer 72 of polysilicon about 1.0 micron thick is deposited over the patterned silicon oxide layer 68 to fill the opening 70. A second layer 74 of silicon oxide about 0.3 micron thick is deposited over the polysilicon layer 72 by LPCVD.

A second polysilicon layer 76 about 1.5 micron thick is deposited over the second sacrificial silicon oxide layer 74. A third sacrificial silicon oxide layer 78 is deposited by PECVD and is patterned to form an opening 80. This layer 80 is polished by chemical mechanical polishing (CMP) and a third layer 82 of polysilicon about 2.25 microns thick is deposited by LPCVD. A fourth layer 84 of silicon oxide about 2 microns in thickness is deposited by PECVD and patterned to form an opening 86, retaining 0.2 micron of silicon oxide under the opening 86. A fourth layer of polysilicon 90, 2.25 microns thick, is deposited over the silicon oxide layer 84 by LPCVD so as to fill the opening 86. A final metal layer 92, which can be of aluminum, titanium and the like about 0.7 micron thick, is deposited by physical vapor deposition (PVD). This metal layer can be patterned to form a mask for further processing.

The silicon oxide layers 68, 78 and 84 are to be at least partially etched away. Such layers include thermal oxide, variously doped oxides such as BPSG, PSG, BPTEOS, TEOS, dTEOS, high temperature oxide (HTO) and the like.

Figure 7:
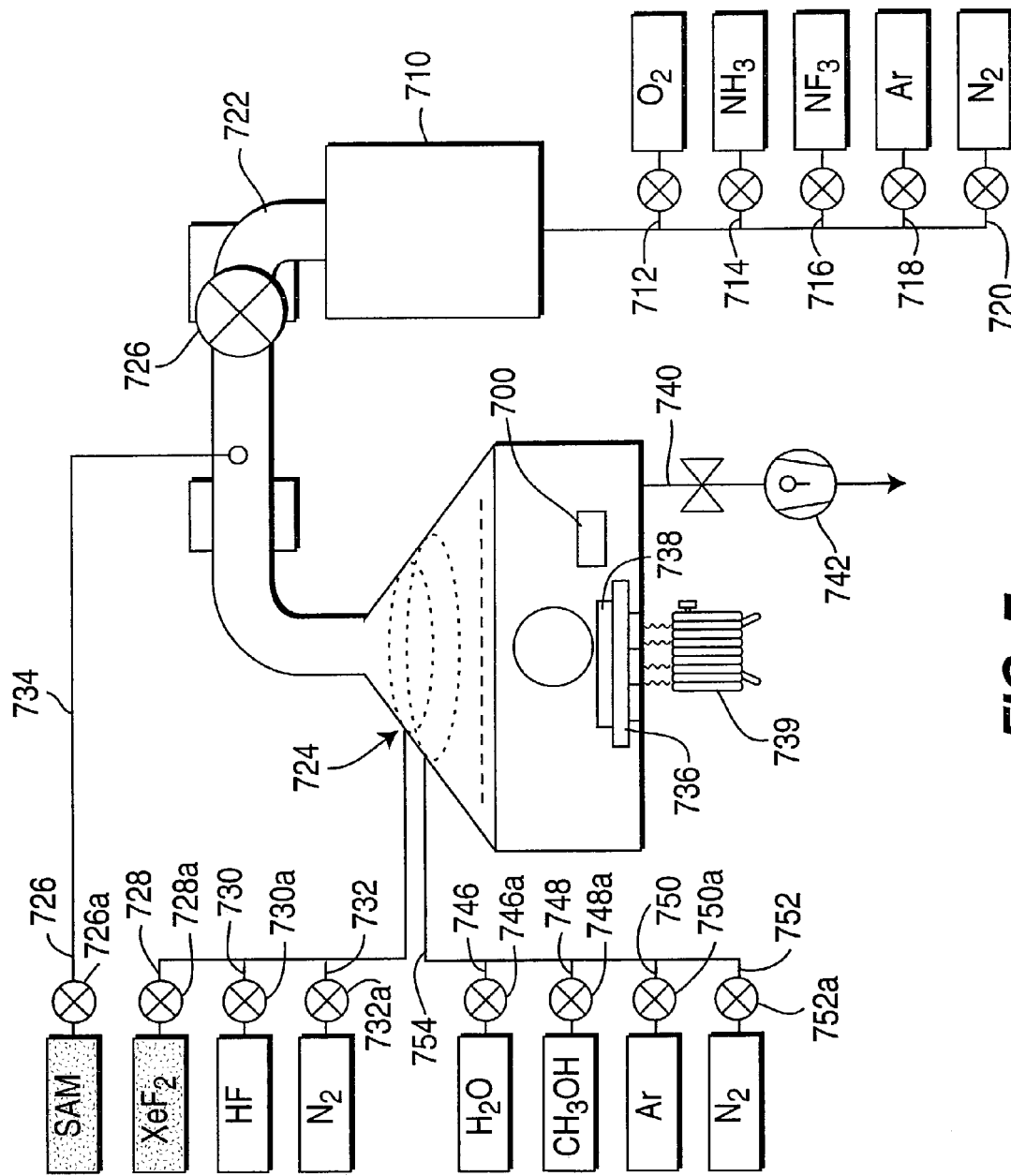
FIG. 7 is a schematic view of an apparatus comprising an etch chamber suitable for carrying out the release etch process described herein, and a remote plasma source chamber for supplying plasma to the etch chamber. The etch chamber in addition can deposit a passivation layer over the formed microstructure.

A typical etch and passivation chamber suitable for carrying out the above HF release etch process and passivation of the released device is shown in FIG. 7.

Referring to FIG. 7, a remote plasma source chamber 710 is commercially available. A plurality of gas sources are connected to suitable lines 712, 714, 716, 718 and 720 to feed one or more gases such as oxygen, ammonia, nitrogen trifluoride, argon and nitrogen as examples, and form a plasma in the remote plasma source chamber 710. The plasma is then fed to a line 722 into an etch chamber 724. A valve 726 adjusts the pressure in the remote chamber 710 and passes plasma to the chamber 724.

A plurality of gas lines 726, 728, 730 and 732 feed etch gases, and passivation gases into the chamber 712 through line 734 and 735 using valves 726a, 728a, 730a and 732a.

The chamber 712 includes a mount 736 for the substrate to be etched 738. The mount 736 is connected to a temperature control means 739, which can be a resistance heater as shown, that maintains the temperature of the substrate generally between about 10 to about 70° C. during the etch reaction. The temperature control means 739 can also be an array of lamps. The chamber 724 is suitably maintained at a temperature of about room temperature during the etch. However, the temperature can be elevated somewhat to remove moisture that may accumulate on the substrate 738.

An exhaust line 740 maintains a suitable pressure in the chamber 724 by means of a valve 742. The pressure in the chamber is suitably maintained at from 100 millitorr to about 5 atmospheres.

A QCM (not shown) will be mounted near the substrate 738 during the etch reaction.

In order to reduce damage to the chamber interior walls and fixtures caused by the use of anhydrous HF, a layer of nickel can be applied to those lines and surfaces that come in contact with anhydrous HF.

The chamber 724 is also capable of depositing a passivation layer over the etched feature to protect it and to prevent stiction during or after etching. Gas lines 746, 748, 750 and 752 for water, methanol, argon and nitrogen as examples, are fed to the chamber 724 through valves 746a, 748a, 750a and 752a via a line 754 leading to the chamber 724. Separate lines are required in some instances to avoid reactions in the gas lines, as for example that between xenon difluoride and water, in the gas lines, rather than in the chamber 724.

The chamber of FIG. 7 thus permits etch processing, removal of water on the substrate, and deposition of a passivation layer on an etched substrate. The QCM etch monitor determines the time required to release etched features to avoid deposition of materials that thereafter would cause stiction.

In order to monitor the amount of material being etched, a mass monitoring device 700 is attached to the chamber 724 near the substrate 736 to be etched. A quartz crystal microbalance (hereinafter QCM) can be used for example to measure the amount of material that is etched away.

Referring to FIG. 8, a suitable QCM to be mounted in the chamber 724 comprises a crystal 800, a spring contact 802, an oscillator 804 and a grounded support ring 805. A substrate 808 to be weighed is mounted on the crystal 800. A shield ring 806 maintains the substrate 808 in place on the crystal 800. An external flange 810, shown in FIG. 8A, can be used to mount the crystal 800 to suitable locations in the processing chamber 724. An external controller 812 stops the flow of gas and thus the etch when the predetermined mass of the released substrate is detected.

FIG. 8B is a cross sectional view of a trilayer substrate 808 mounted on a crystal 800. An opening 820 through the upper layer 814 permits isotropic etching in the sacrificial layer 819.

FIG. 8C illustrates a more complex substrate having two sacrificial oxide layers 852 and 856 having patterned openings therein. The sacrificial layers 852 and 856 are partially etched away to provide release for features to be formed therein.

As an example, a piezoelectric device can be used that oscillates with the application of an alternating high frequency electric field by means of electrodes coupled with the crystal. This device monitors the mass of the material mounted upon the QCM. When the desired amount of material has been etched away, the controller 812, connected to the processing chamber 724, stops the reaction.

There are several ways to determine the amount of material to be etched away to form a properly released device.

A test substrate can be placed in the chamber 724 having the same configuration as the structure to be made. When using a QCM as described above, the substrate is placed on the crystal of the microbalance. The substrate and material are then exposed to processing conditions in the chamber that will etch away at least a portion of the monitored material, when its mass is measured. Thus the amount of material removed in a given period of time is measured. The etch time required for release of the test substrate is then determined. This provides the etch time for successive like release etch procedures that will remove the desired amount of material from the test substrate. The amount of material to be removed can be from several microns up to hundreds of microns of oxide for example.

Alternately, a plurality of substrates can be processed in a chamber for different lengths of time and compared to a properly released device to determine the time required for proper release of the structure to be made.

Another method is to stop processing and inspect the test substrate periodically until the desired release is obtained, when the time required is noted.

Once the correct etch conditions and time to release are determined, the time of processing alone under the test conditions can be monitored to determine when appropriate release will be obtained. At that point the reaction is stopped.

The mass of material remaining can also be monitored as above, to determine when appropriate release of a device from its substrate has been obtained.

A representative release structure is made on the Quartz crystal using semiconductor processing techniques.

In another method, an actual product die to be released can be mounted with an adhesive, such as photoresist or epoxy resin, i.e., one that is resistant to the release etchant. Once release is obtained, the QCM records an appropriate loss of mass.

In order to release features from a substrate, the etchant must be an isotropic etchant, that is, the material being etched is removed in all directions.

The semiconductor silicon oxide material can be suitably etched using anhydrous HF in the chamber of FIG. 7 using a gas flow of 1 liter/min of HF, 0.5 l/min of nitrogen and 33 sccm of isopropyl alcohol at a chamber pressure of 100 Torr. The isopropyl alcohol helps to remove any excess moisture formed from the oxide layer during etching.

Issues for controllable release using semiconductor etch processing include the variability of the etch rate depending on the type of silicon or silicon oxide used; the process; the etchant used; and the device design. For example, the etch rate to etch a silicon oxide substrate as shown in FIG. 8B may be different from the etch rate to etch the same silicon oxide as shown in FIG. 8C. For use with silicon-containing materials, anhydrous HF is a preferred etchant because the issues relative to capillary action causing stiction are no longer applicable. However, since the etch initiation times for different silicon oxides vary with the amount of water in the oxide, a real time etch monitor is required.

For anhydrous HF etches, the etch temperature is also important. As the temperature increases, there is an increased difference in adsorbed water on doped and undoped oxides, increasing the anhydrous HF selectivity.

The exemplary etchant for silicon oxides, employed above, is anhydrous hydrogen fluoride, which provides a clean, rapid, isotropic etch.

When silicon is used as the substrate, a suitable etchant for shaping the silicon layers is $XeF_2$, which spontaneously etches silicon without the need for plasma formation or any excitation of the gas. However, other known silicon etchants can be used, particularly fluorine-containing gases that produce free fluorine species that readily etch silicon. Such fluorine-containing gases include nitrogen trifluoride ($NF_3$) or sulfur hexafluoride ($SF_6$) for example.

Although the invention has been described in terms of particular embodiments, other known monitoring methods and materials can be substituted as will be known to those skilled in the art. Thus the invention is only meant to be limited by the scope of the appended claims.

We claim:

1. A method of determining the release time of a microelectromechanical feature in real time comprising
   a) mounting a mass monitoring device in a processing chamber;
   b) mounting a multilayer silicon-containing substrate in the processing chamber, said substrate comprising more than one alternative layers of silicon oxide and polysilicon, said polysilicon layers including an opening therein down to the underlying silicon oxide layer;
   c) connecting the substrate to the mass monitoring device;
   d) isotropically etching the substrate in said chamber with anhydrous hydrogen fluoride until at least a portion of a topmost layer of the substrate is released from the substrate; and
   e) determining the mass of material that is etched away.

2. A method according to claim 1 wherein said multilayer silicon-containing substrate comprises a silicon-containing substrate a first layer of a sacrificial silicon oxide layer thereover, and a layer of polysilicon over the silicon oxide layer.

3. A method according to claim 2 wherein the time to release is determined.

4. A method according to claim 1 wherein the mass monitoring device is a quartz crystal microbalance.

5. A method of determining the release of microelectromechanical systems in real time comprising
   a) mounting a mass monitoring device in a processing chamber;
   b) mounting a multilayer silicon-containing substrate in the processing chamber, said substrate comprising more than one alternative layers of silicon oxide and polysilicon, said polysilicon layers including an opening therein down to the underlying silicon oxide layer;
   c) connecting the substrate to the mass monitoring device;
   d) determining the mass of a released die feature to be made;
   e) isotropically etching the substrate in said chamber with anhydrous hydrogen fluoride until the substrate reaches the mass of the released die feature; and
   f) stopping the etching.

6. A method according to claim 5 wherein said substrate is mounted to said mass monitoring device with an etchant-resisting material.

7. A method of determining release of a microelectromechanical feature from a substrate comprising:
   a) measuring the mass of a released structure;
   b) mounting a multilayered silicon-containing substrate comprising a silicon substrate in an etch chamber, wherein said substrate comprises more than one alternate layers of silicon oxide and polysilicon, said polysilicon layers including an opening therein down to the underlying silicon oxide layer;
   c) mounting a mass monitoring device in said etch chamber;
   d) etching said multilayered silicon-containing substrate with anhydrous hydrogen fluoride to etch away a portion of said silicon oxide layer and monitoring the substrate mass until its mass is equal to that of the released structure; and
   e) stopping the etch process.

* * * * *

UNITED STATES PATENT AND TRADEMARK OFFICE
CERTIFICATE OF CORRECTION

PATENT NO. : 7,052,622 B2  
APPLICATION NO. : 10/265620  
DATED : May 30, 2006  
INVENTOR(S) : Chinn et al.

Page 1 of 1

It is certified that error appears in the above-identified patent and that said Letters Patent is hereby corrected as shown below:

On Title page, in item (56), under "Foreign Patent Documents", in column 2, line 1, after "4/1998" insert -- H01L/21/66 --.

On Title page, in item (56), under "Foreign Patent Documents", in column 2, line 2, after "9/1989" insert -- H01L/21/306 --.

column 7, line 21, in Claim 2, after "substrate" insert -- , --.

Signed and Sealed this

Nineteenth Day of September, 2006

JON W. DUDAS  
*Director of the United States Patent and Trademark Office*